(12) United States Patent
Jun et al.

(10) Patent No.: US 8,089,151 B2
(45) Date of Patent: Jan. 3, 2012

(54) CONDUCTIVE PARTICLES FOR ANISOTROPIC CONDUCTIVE INTERCONNECTION

(75) Inventors: Jung Bae Jun, Kyeonggi-do (KR); Jin Gyu Park, Seoul-si (KR); Heung Se Lee, Kyeonggi-do (KR)

(73) Assignee: Cheil Industries, Inc. (KR)

( * ) Notice: Subject to any disclaimer, the term of this patent is extended or adjusted under 35 U.S.C. 154(b) by 227 days.

(21) Appl. No.: 11/500,018

(22) Filed: Aug. 7, 2006

(65) Prior Publication Data

US 2007/0145585 A1 Jun. 28, 2007

(30) Foreign Application Priority Data

Dec. 28, 2005 (KR) .................. 10-2005-0131736

(51) Int. Cl.
*H01L 23/48* (2006.01)

(52) U.S. Cl. ......... 257/738; 257/737; 257/741; 257/748
(58) Field of Classification Search .................. 257/780, 257/741, 748; 438/584
See application file for complete search history.

(56) References Cited

U.S. PATENT DOCUMENTS 6,770,369 B1 * 8/2004 Oyamada et al. ............. 428/403

FOREIGN PATENT DOCUMENTS

| JP | 7118866 | 5/1995 |
| JP | 2507381 | 4/1996 |
| JP | 2000-243132 | 9/2000 |
| JP | 2003197028 | * 7/2003 |

* cited by examiner

*Primary Examiner* — Marcos D. Pizarro
*Assistant Examiner* — Eva Montalvo
(74) *Attorney, Agent, or Firm* — Myers Bigel Sibley & Sajovec PA

(57) ABSTRACT

Embodiments of the present invention include a conductive particle that includes a conductive nickel/gold (Ni/Au) complex metal layer having a phosphorous content of less than about 1.5 weight percent formed on the surface of a polymer resin particle. Methods of forming the same are also included. A conductive particle with a Ni/Au complex metal layer having less than about 1.5 weight percent of phosphorous may have relatively high conductivity while providing relatively good adhesion of the Ni/Au metal layer to the polymer resin particle.

Further embodiments of the present invention provide an anisotropic adhesive composition comprising a conductive particle according to an embodiment of the invention.

8 Claims, No Drawings

CONDUCTIVE PARTICLES FOR ANISOTROPIC CONDUCTIVE INTERCONNECTION

CLAIM OF PRIORITY

This application claims priority under 35 U.S.C. §119 to Korean Application No. 2005-0131736, filed on Dec. 28, 2005, the contents of which are herein incorporated by reference in their entirety.

FIELD OF THE INVENTION

The present invention relates to conductive particles that may exhibit electrical connectivity when combined with anisotropic conductive interconnection materials. More specifically, the present invention relates to conductive particles formed by plating metal complex layers onto polymer resin particles.

BACKGROUND OF THE INVENTION

Conductive materials, including conductive metal particles and metal-plated resin particles, are currently be used in electrical connections between microelectrodes of electronic devices, e.g., between ITO electrodes and driver IC circuits, between driver IC chips and circuit boards and between micro-pattern electrode terminals in liquid crystal display (LCD) panels. In particular, conductive particles that include metal coated onto deformable and recoverable polymer resin particles may be used in electrical connections and may provide reliable interconnectivity for long time periods. In recent years, as the pitch of circuits has become finer and the area of bump electrodes has become smaller, the conductivity and electrical reliability of conductive particles may be even more important to providing a suitable electrical connection.

A complex conductive particle may be prepared by coating a conductive metal, e.g., gold (Au), silver (Ag), copper (Cu), platinum (Pt), palladium (Pd), nickel (Ni), cobalt (Co), tin (Sn) and indium (In), onto the non-conductive surface of a polymer resin particle by plating. The electrical and physiochemical properties of the final particle may be varied according to the kind and number of metals being introduced. A Ni/Au complex metal layer has previously been used as the metal layer in a conductive particle used in an anisotropic conductive film (See, e.g., Japanese Patent Laid-Open Nos. 1999-329060 and 2000-243132). A Ni/Au complex metal layer may be desirable because nickel may be readily formed into a thin metal layer by electroless plating, while Au may provide the particle with excellent conductive properties. Thus, a conductive particle having a Ni/Au complex metal layer may exhibit stable electrical connection properties at a connection site of a semiconductor or other mounting device.

Japanese Patent Laid-Open No. 2000-243132 describes a Ni/Au complex plating layer formed by electroless plating a substantially indiscrete Ni layer on a polymer resin particle, and then forming a Au layer on the Ni layer by substitution plating. The phrase "substantially indiscrete Ni layer" as used herein refers to a plating layer having a thickness of 5 nm or more formed by deposition of Ni particles during plating. When taking into account plating adhesion to the base particles, the Ni layer commonly has a thickness of about 50 nm to about 70 nm. The substantially indiscrete Ni layer may facilitate the introduction of the Au layer. However, when a conductive particle having a Ni plating layer within this thickness range is interposed between electrodes and compressively deformed, peeling between the Ni layer and the polymer resin particle may occur. When compressive deformation is continued, peeling may lead to the rupture of the Ni layer, resulting in decreased electrical connection. This may occur because the Ni layer is harder and less flexible than the polymer particle.

Various efforts have been made to alter the properties of Ni layers formed on polymer resin particles. For example, Japanese Patent Laid-Open No. 2507381 describes conductive particle having a Ni layer coated onto a resin particle, wherein the Ni layer has a phosphorous content of between 1.5 to 4 weight percent. Such particles are described as having increased flexibilty and adhesion relative to lower concentrations of phosphorus and increased conductivity under high temperature and humidity conductions and improved corrosion resistance relative to Ni plating layers with higher levels of phosphorous. However, such conductive particles may aggregate due to the magnetism generated by the low phosphorous content. Further, during disintegration for dispersing the aggregated particles, peeling and rupture of the plated layer may occur.

Japanese Patent Laid-Open No. Hei 7-118866 describes a conductive particle having a nickel-phosphorous alloy layer with 7 to 15 weight percent phosphorous plated onto the surface of a spherical core material by electroless plating. By incorporating 7 to 15 weight percent of phosphorous, aggregation during plating or re-aggregation during dispersion may be reduced, which may improve the dispersibility of the conductive particles. However, the conductivity of the particles may be decreased due to the high phosphorous content of the plating layer.

Thus, a specific content of phosphorous cannot ensure that a conductive particle has both desirable adhesion and desirable conductivity. Further, the flexibility of the nickel-phosphorous plating layer may be somewhat dependent on the electroless plating conditions. In addition, there is no clear trend regarding the effect of the phosphorous content on the properties of conductive particles that include a nickel-phosphorous alloy and another metal. However, it is known that the electrical resistance of a conductive particle generally increases as the amount of phosphorous in the nickel-phosphorous layer increases.

Therefore, it would be desirable to provide highly reliable conductive particles for anisotropic interconnection that include a Ni/Au complex plating layer with a controlled phosphorous content formed onto the surface of polymer resin particles. It would further be desirable for the polymer resin particles to be relatively uniform in size, for the Ni/Au complex metal plating to adhere sufficiently to the surface of the polymer resin particles, and for the particles to have desirable conductive properties.

SUMMARY OF THE INVENTION

Embodiments of the present invention include a conductive particle that includes a conductive nickel/gold (Ni/Au) complex metal layer having a phosphorous content of less than about 1.5 weight percent formed on the surface of a polymer resin particle. A conductive particle with a Ni/Au complex metal layer having less than about 1.5 weight percent of phosphorous may have relatively high conductivity while providing relatively good adhesion of the Ni/Au metal layer to the polymer resin particle.

In some embodiments of the present invention, the Ni/Au complex metal layer may include a first layer that is substantially Ni encompassed by a second layer that is substantially Au. In some embodiments, the Au plating layer has a thickness in a range of about 0.01 to about 0.5 μm. In some embodiments, the Ni/Au complex metal layer includes a Au gradient wherein the Ni/Au complex metal layer essentially includes Ni at the surface of the polymer resin particle and essentially includes Au at the outer surface of the conductive particle.

In some embodiments of the present invention, the difference between the 10% compression (10% K) value of the polymer resin particle and the conductive particle is about 100 kgf/mm$^2$ or less. Thus, when the conductive particle and the polymer resin particle have relatively similar 10% K values, the adhesion of the Ni/Au complex metal layer to the polymer resin particle may be desirable.

Further embodiments of the present invention provide an anisotropic adhesive composition comprising a conductive particle according to an embodiment of the invention.

Methods of forming a conductive particle are also provided, wherein, in some embodiments, a conductive particle may be formed by performing electroless Ni plating of a polymer resin particle followed by gold plating of the polymer resin particle to form a conductive particle according to an embodiment of the invention. In other embodiments, a conductive particle may be formed by performing gold plating during electroless Ni plating of a polymer resin particle to form a conductive particle according to an embodiment of the invention.

DETAILED DESCRIPTION OF THE INVENTION

The invention is described more fully hereinafter. This invention may, however, be embodied in many different forms and should not be construed as limited to the embodiments set forth herein. Rather, these embodiments are provided so that this disclosure will be thorough and complete, and will fully convey the scope of the invention to those skilled in the art.

It will be understood that when an element or layer is referred to as being "on," another element or layer, it can be directly on, connected to, or coupled to the other element or layer, or intervening elements or layers may be present. In contrast, when an element is referred to as being "directly on," "directly connected to," or "directly coupled to" another element or layer, there are no intervening elements or layers present. Like numbers refer to like elements throughout. As used herein, the term "and/or" includes any and all combinations of one or more of the associated listed items.

The terminology used herein is for the purpose of describing particular embodiments only and is not intended to be limiting of the invention. As used herein, the singular forms "a", "an," and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

In some embodiments of the present invention, a conductive particle that includes a nickel/gold (Ni/Au) complex metal layer having a phosphorous content of less than 1.5 weight percent formed on the surface of a polymer resin particle is provided. In some embodiments, the Ni/Au complex metal layer has a phosphorous content of between 0.3 and 1.5 weight percent. As used herein, the phrase "complex metal layer" is meant to refer to any combination of Ni and Au coated onto the polymer resin particle, such as, for example, a complex metal layer having a Au layer plated directly onto a Ni layer, or a complex metal layer wherein the Ni and Au are completely intermixed. Further, as used herein, the polymer resin particle is also referred to a base particle. The Ni/Au complex metal layer may be formed by electroless Ni plating. Electroless plating is a chemical reduction process which depends upon the catalytic reduction process of nickel ions in an aqueous solution that containins a chemical reducing agent, and the subsequent deposition of nickel metal without the use of electrical energy.

According to some embodiments, the Ni/Au complex metal layer is formed by performing electroless Ni plating on a polymer resin particle followed by Au plating. In such embodiments, the preparation of the conductive particle may be carried out in three steps: 1) pretreatment of the base particle, for example, by defatting, etching, sensitizing, catalyzing and/or treating with a reducing agent; 2) electroless Ni plating and washing; and 3) Au substitution or electroless plating.

When a conductive particle is formed by electroless Ni plating followed by gold plating, a first layer may be formed on the polymer resin particle that is substantially Ni and may be encompassed by a second layer that is substantially Au. Thus, in some embodiments, the first layer may be substantially similar to a Ni layer formed in the absence of Au. The Ni layer may have a composition typical of a Ni layer formed by electroless plating and so may include impurities, including phosphorous. Further, in some embodiments, the second layer may be substantially similar to a Au layer formed by plating (e.g., electroless or substitution plating) in the absence of a Ni layer, and may also include impurities. Further, according to some embodiments of the present invention, methods are provided for forming a conductive particle that include performing electroless Ni plating of a polymer resin particle followed by performing gold plating of the polymer resin particle to form a conductive particle according to an embodiment of the invention.

According to other embodiments, the Ni/Au complex metal layer may be formed by performing Au plating during the electroless Ni plating. This may result in a Ni/Au complex plating layer having a density gradient. Thus, for example, in a plating layer with such a density gradient, the Ni concentration of the metal layer may decrease and the Au concentration may increase from the surface of the polymer resin particles to the outermost surface of the metal layer, so that the surface of the conductive particle may be predominantly Au. Thus, a conductive particle according to an embodiment of the invention may include a Ni/Au complex metal layer that includes a Au density gradient wherein the Ni/Au metal complex layer consists essentially of Ni at the surface of the polymer resin particle and consists essentially of Au at the outer surface of the conductive particle. Further, according to some embodiments of the present invention, methods are provided for forming a conductive particle that include performing gold plating during electroless Ni plating of a polymer resin particle to form a conductive particle according to an embodiment of the invention.

Electroless plating may be achieved by the following method. First, the polymer resin particle may be dipped in a surfactant solution that is suitable for washing and defatting the surface of the particle. Thereafter, etching may be performed using a mixed solution of chromic and sulfuric acids to form anchors on the surface of the base resin particle. The surface-treated base resin particle may then be dipped into a solution of tin chloride and palladium chloride to catalyze and activate the surface of the particle. As a result, fine nuclei of the palladium catalyst may be formed on the surface of the base particle. Subsequently, a reduction reaction may be carried out using sodium hypophosphite, sodium borohydride, dimethyl amine borane, hydrazine, and the like, to form uniform palladium nuclei on the resin particle. The resulting base particle may then be dispersed in an electroless Ni plating solution, after which the Ni salts may be reduced using sodium hypophosphite to form an electroless Ni plating layer on the base particle. In some embodiments, the Ni plated particle may then be added to a Au plating solution sufficient to induce a substitution plating or electroless Au plating reaction, thereby forming a Au-deposited plating layer on the outermost layer of the particle.

The electroless Ni plating solution may contain Ni ions and a reducing agent. A reducing agent, such as sodium hypophosphite, may be used to form an electroless nickel-phosphorous plating layer. The generally accepted mechanism for the deposition of an electroless nickel-phosphorous plating layer with sodium hypophosphite is as follows:

$$NiSO_4 + 2NaH_2PO_2 + 2H_2O \rightarrow Ni + 2NaH_2PO_3 + H_2 + H_2SO_4 \quad (1)$$

$$NaH_2PO_2 + \frac{1}{2}H_2 \rightarrow P + NaOH + H_2O \quad (2)$$

According to this mechanism, as reaction (1) proceeds, the reactants are consumed and sulfuric acid is formed, causing a decrease in the pH of the plating solution. Subsequently, phosphorous enters the plating layer by reaction (2). The phosphorous content of the plating layer may decrease as the deposition rate is increased. The plating deposition rate may be affected by the composition of the plating solution. For example, the concentration of the Ni ions and the reducing agent, the complexing strength of an added complexing agent, the concentration of an added promoting agent, pH, etc., are factors that may affect the deposition rate.

The phosphorous content of a nickel-phosphorous electroless plating layer may influence its physical and electrical properties, which may thus affect the physical properties of the conductive particle. As the phosphorous content of an electroless Ni plating layer is decreased, the amount of Ni crystal formed may be increased, which may lead to an increase in density and hardness, the generation of magnetism and a decrease in resistivity. Further, the increase in hardness and decrease in the flexibility of a nickel-phosphorous plating layer with reduced phosphorous may lead to deterioration in the adhesion of the plating layer to the polymer resin particle.

However, the present inventors have unexpectedly discovered that when Au plating is performed during or after the electroless Ni plating to form a Ni/Au complex layer, as the phosphorous content of the Ni layer is decreased, the hardness and electrical resistance of the plating layer may both also decrease. Thus, conductive particles that have relatively good adhesion of the plating layer and relatively low resistance may be formed.

Thus, when the phosphorous content of the Ni/Au electroless plating layer of a conductive particle according to an embodiment of the invention is greater than about 1.5 weight percent, the compression hardness of the conductive particles may be high, and may be much higher than that of the polymer resin particle. The disparity in hardness between the base polymer resin particle and the Ni/Au plating layer may lead to a disparity in compression deformability and elasticity. As a result, when a force or pressure is applied to the conductive particle, the Ni/Au metal layer may peel from the resin particle or rupture, thus deteriorating the adhesion of the plating layer to the resin particle.

Therefore, in some embodiments of the present invention, the phosphorous content of the Ni/Au complex plating layer formed on a base particle by electroless plating is less than 1.5 wt %, and in some embodiments, between 0.3% and 1.5 weight percent. In this case, the conductive particle may have only a slightly greater compression hardness than that of the polymer resin particle. The decrease in the disparity between the hardness of the Ni/Au complex metal layer and the polymer resin particle may improve the adhesion of the Ni/Au complex metal layer to the surface of the polymer resin particle. This improved adhesion may, in turn, provide the conductive particle with enhanced conductive properties, even under pressure. Furthermore, since the Ni/Au electroless plating layer with a phosphorous content of less than 1.5 weight percent may show relatively low resistance compared to plating layers with higher phosphorous content, the conductive particle may exhibit excellent conductive properties.

The influence of the phosphorous content of the plating layer on the hardness of the conductive particle is as follows. In general, the relationship between the compressive force applied to a particle and the amount of compressive deformation of the particle can be approximated by Equation 1:

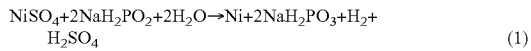

$$F = \frac{\left(\frac{\sqrt{2}}{3}\right) \cdot S^{\frac{3}{2}} \cdot E \cdot R^{\frac{1}{2}}}{1 - \sigma^2} \quad (1)$$

when F is the load value (kg) at x % compressive deformation, S is the compression displacement (mm) at x % compressive deformation, E is the compressive elastic modulus of the particles (kgf/mm²), R is the radius of the particles (mm) and σ is the Poisson's ratio of the particle.

K is the compression hardness wherein:

$$K = \frac{E}{1 - \sigma^2} \quad (2)$$

Thus, the K value may be calculated by Equation 3:

$$K = \left(\frac{3}{\sqrt{2}}\right) \cdot F \cdot S^{-\frac{3}{2}} \cdot R^{-\frac{1}{2}} \quad (3)$$

The K value may be measured using a micro-compression tester (MCT-W series, Shimadzu Corporation Ltd., Japan). Specifically, the K value may be measured by fixing a single particle between a smooth upper pressure indenter (diameter: 50 μm) and a lower pressure plate, compressing the single particle at a compression speed of 0.2275 gf/sec and a maximum test load of 5 gf to obtain a load value and a compression displacement, and substituting the obtained values into the above equation. To universally and quantitatively compare the K value representing the hardness of a particle, a K value at 10% deformation (10% K value) is referred to herein.

As described above, since a conductive particle according to some embodiments of the present invention has a phosphorous content of less than 1.5 wt %, the plating layer may have the desired adhesion while maintaining the desired conductivity. For this to occur, the difference in the 10% K value between the polymer resin particle and the conductive particle (the particle after plating with a Ni/Au complex metal layer) may be relatively small (100 kgf/mm² or less). Thus, in some embodiments of the present invention, the difference in the 10% K value of the polymer resin particle and the conductive particle is 100 kgf/mm² or less.

When the phosphorous content of the plating layer exceeds 1.5 wt %, the difference between the 10% K value of the polymer resin particle and the conductive particle may be much greater than 100 kgf/mm². In addition, as discussed above, the relative hardness of the Ni/Au complex plating layer may lead to a deterioration in adhesion and electrical reliability. This difference may be even more pronounced when a soft polymer resin particle is used. Accordingly, a conductive particle with a Ni/Au complex metal layer having a phosphorous content greater than about 1.5 weight percent may exhibit poor adhesion and electrical connection reliability.

In some embodiments of the present invention, the base particle is a polymer resin particle having a 10% K value in a range of about 200 to about 700 kgf/mm². When a polymer resin particle within this 10% K range is interposed between facing electrodes of a constant gap size, connection may be enabled without any damage occurring to the electrodes. When the 10% K value of the polymer resin particle is lower than about 200 kgf/mm², excessive deformation may occur as a result of pressure applied upon connection, and as a result, the metal layer may be ruptured or peel off of the base particle, which may lead to poor electrical connection and reliability. However, if the 10% K value of the polymer resin particle exceeds about 700 kgf/mm², a conductive particle interposed between the electrodes may not deform sufficiently, and thus, the contact area between electrode surface and the conductive particle may not be sufficiently increased, which may make it difficult to lower the connection resistance. Further, a polymer resin particle with a 10% K value greater than about 700 kgf/mm² may be so hard that it damages the electrode surface when a relatively high compression force is applied, thus increasing the risk of poor electrical connection and low connection reliability.

According to some embodiments of the present invention, the electroless Ni/Au complex metal layer of a conductive particle may have a thickness in a range of about 0.01 to about 1 μm. When the thickness of the metal layer is less than about 0.01 μm, it may be difficult to attain the desired conductivity. However, when the thickness of the metal layer exceeds about 1 μm, the deformability, flexibility and recoverability of the particle may not be desirable, and the particle may aggregate with other particles when used in electrode packaging materials, which may make it difficult to obtain desirable electrical properties. In some embodiments, it is preferred that the metal layer has a thickness in a range of about 0.05 to about 0.5 μm.

According to some embodiments of the present invention, the Ni/Au complex metal layer includes a Au plating layer having a thickness in a range of about 0.01 to about 0.5 μm. When the phosphorous content of the Ni plating layer is decreased, the amount of Ni crystal may be increased and the Ni plating layer may be magnetic, which may cause aggregation of the conductive particles. However, since the Au plating layer may be formed on the surface of the Ni plating layer, control over the thickness of the Au plating layer may substantially prevent the conductive particles from aggregating despite the presence of a magnetic Ni layer, or even if aggregated, may allow the conductive particles to be dispersed with only weak stirring, shear force or pressure. If the Au plating layer has a thickness of less than about 0.01 μm, the magnetism of the Ni plating layer may greatly influence the aggregation of the conductive particles, which may make it difficult to achieve desirable properties. However, when the Au plating layer has a thickness greater than about 0.5 μm, the specific gravity of the conductive particles may be too high, thus causing precipitation or aggregation of the conductive particles when dispersed in a binder resin. Furthermore, the use of large amounts of Au may be economically disadvantageous.

While many materials may be suitably used as the base polymer resin particle, the polymer resin particle may include, but is not limited to, one or more of polyethylene, polypropylene, polyvinyl chloride, polystyrene, polytetrafluoroethylene, polyethylene terephthalate, polybutylene terephthalate, polyamide, polyimide, polysulfone, polyphenylene oxide, polyacetal, urethane resins, unsaturated polyester resins, (meth)acrylate resins, styrene-based resins, butadiene resins, epoxy resins, phenol resins and melamine resins. Copolymers, blends and mixtures of the may be used.

Due to the requirements for compressive deformability and compression recoverability upon anisotropic conductive interconnection, in some embodiments of the present invention, styrene-based and (meth)acrylate resins are preferred. In some embodiments, crosslinking polymer resins including at least one crosslinking polymerizable monomer are preferred. Suitable crosslinking polymerizable monomers may include allyl compounds, e.g., divinylbenzene, 1,4-butanediol di(meth)acrylate, 1,6-hexanediol di(meth)acrylate, 1,9-nonanediol di(meth)acrylate, allyl(meth)acrylate, divinylsulfone, diallyl phthalate, diallylacrylamide, triallyl (iso)cyanurate and triallyl trimellitate; (poly)alkylene glycol di(meth)acrylate, e.g., (poly)ethylene glycol di(meth)acrylate and (poly)propylene glycol di(meth)acrylate; (poly)dimethylsiloxane di(meth)acrylate; (poly)dimethylsiloxane divinyl; (poly)urethane di(meth)acrylate; pentaerythritol tri(meth)acrylate; pentaerythritol di(meth)acrylate; trimethylolpropane tri(meth)acrylate; di(trimethylolpropane) tetra(meth)acrylate; tetramethylolpropane tetra(meth)acrylate; dipentaerythritol hexa(meth)acrylate; dipentaerythritol penta(meth)acrylate; and glycerol tri(meth)acrylate. The crosslinking polymerizable monomers may be used alone or in any combination thereof.

Other monomers, which may be used alone or in combination with the crosslinking polymerizable monomers, include, but are not limited to, styrene-based monomers, e.g., styrene, ethyl vinyl benzene, α-methyl styrene and m-chloromethyl styrene; (meth)acrylates, including methyl(meth)acrylate, ethyl(meth)acrylate, propyl(meth)acrylate, n-butyl (meth)acrylate, isobutyl(meth)acrylate, t-butyl(meth)acrylate, 2-ethylhexyl(meth)acrylate, n-octyl(meth)acrylate, lauryl(meth)acrylate, stearyl(meth)acrylate, ethylene glycol (meth)acrylate and glycidyl(meth)acrylate; chlorovinyl; acrylic acid esters; acrylonitrile; vinyl acetate; vinyl propionate; vinyl butyrate; vinyl ether; allyl butyl ether; butadiene and isoprene. The monomers may be used alone or in any combination thereof.

The polymer resin particle may be prepared by any suitable polymerization method, including, but not limited to, suspension polymerization, dispersion polymerization, seeded polymerization and surfactant-free emulsion polymerization.

In some embodiments of the present invention, seeded polymerization is employed to prepare polymer resin particles having a uniform particle diameter distribution, without the need for any additional classification process. An exemplary procedure is as follows. First, polymer seed particles having a small diameter and a very narrow diameter distribution may be dispersed in an aqueous solution. To this dispersion may be added an aqueous emulsion of a (crosslinking) polymerizable unsaturated monomer in which an oil-soluble initiator is dissolved. This addition may allow the monomer to be absorbed into the seed particles. Thereafter, the (crosslinking) polymerizable unsaturated monomer may be polymerized to prepare polymer resin particles. The molecular weight of the polymer seed particles may greatly affect the phase separation and mechanical properties of the polymer resin particles prepared by seeded polymerization. Thus, in some embodiments, the molecular weight of the polymer seed particles is preferably in a range of about 1,000 to about 30,000 g/mol, and in some embodiments, preferably in a range of about 3,000 to about 20,000 g/mol. In addition, the content of the (crosslinking) polymerizable unsaturated monomer is preferably in a range of about 20 to about 300 parts by weight, based on one part by weight of the polymer seed particles.

In some embodiments of the present invention, the initiator used to prepare the polymer resin particle is an oil-soluble radical initiator, including, but not limited to, peroxide-based compounds, e.g., benzoyl peroxide, lauryl peroxide, o-chlorobenzoyl peroxide, o-methoxybenzoyl peroxide, t-butylperoxy-2-ethylhexanoate, t-butyl peroxyisobutyrate, 1,1,3,3-tetramethylbutylperoxy-2-ethylhexanoate, dioctanoyl peroxide and didecanoyl peroxide; and azo compounds, e.g., 2,2'-azobisisobutyronitrile, 2,2'-azobis(2-methylbutyronitrile) and 2,2'-azobis(2,4-dimethylvaleronitrile). In some embodiments, it is preferred that the initiator be used in an amount in a range of about 0.5 to about 15% by weight, based on the total weight of the monomer.

In the course of the polymerization of the polymer resin particles, if necessary, a surfactant and a dispersion stabilizer may be used to secure the stability of the latex. Examples of suitable surfactants include surfactants commonly used in the art, such as anionic, cationic and non-ionic surfactants.

Further, a dispersion stabilizer may be used. A dispersion stabilizer is a material that can be dissolved or dispersed in polymerization media, and specific examples thereof include, but are not limited to, water-soluble polymers, e.g., gelatin, starch, methylcellulose, ethylcellulose, hydroxyethylcellulose, carboxymethylcellulose, polyvinylpyrrolidone, polyvinyl alkyl ether, polyvinyl alcohol, polyacrylic acid, polyacrylamide, polyethylene oxide and sodium polymethacrylate; barium sulfate; calcium sulfate; calcium carbonate; calcium phosphate; aluminum sulfate; talc; clay; diatomaceous earth; and metal oxide powders. These materials may be used alone or in any combination thereof. The dispersion stabilizer may be used in an amount sufficient to inhibit settlement of the polymer resin particles formed during polymerization due to gravity and aggregation of the particles. In some embodiments, the dispersion stabilizer is preferably used in an amount in a range of about 0.01 to about 15 parts by weight, based on 100 parts by weight of all the reactants.

A polymer resin particle used as a base particle for a conductive particle, according to some embodiments of the present invention, may be spherical, and in some embodiments, preferably has an average diameter in a range of about 1 to about 20 μm. In some embodiments, the polymer resin particle preferably has an average diameter in a range of about 2 to about 10 μm. When the base particle has a particle diameter of less than about 1 μm, the conductive particle may tend to aggregate with other conductive particles. However, a base particle having a particle diameter exceeding 20 μm is not commonly used as a conductive particle used in micropackaging materials.

The conductive particles, according to some embodiments of the present invention, have a coefficient of variation (CV) of particle diameter of about 10% or less. The CV value, which measures the uniformity of the particle diameter (monodispersity), refers to the percentage obtained by dividing the standard deviation of the particle diameter by the average particle diameter. In some embodiments, the conductive particles preferably have a CV value of about 5% or less.

In some embodiments of the present invention, the conductive particles have an aspect ratio of about 1.3 or less. The aspect ratio refers to the ratio of the diameter of the longest axis of a single particle to the diameter of the shortest axis of a single particle. In some embodiments, the conductive particles preferably have an aspect ratio of 1.2 or less.

A conductive particle according to some embodiments of the present invention may be used as a conductive filler having desirable anisotropic conductive interconnection performance, and may be used to prepare an anisotropic conductive adhesive composition that may have improved interconnection and interconnection reliability. Thus, in some embodiments, an anisotropic adhesive composition that includes a conductive particle according to an embodiment of the invention is provided.

The present invention will now be described in more detail with reference to the following examples. However, these examples are given for the purpose of illustration and are not to be construed as limiting the scope of the invention.

EXAMPLES

Example 1

Preparation of Seed Particles 30 parts by weight of a styrene monomer, 6 parts by weight of 2,2'-azobis(2,4-dimethylvaleronitrile) as an initiator, 6.5 parts by weight of polyvinylpyrrolidone (molecular weight: 40,000 g/mol), and a mixed solution of 190 parts by weight of methanol and 15 parts by weight of ultrapure water as reaction media were added to a reactor. Thereafter, the reaction mixture was subjected to polymerization in a nitrogen atmosphere at 70° C. for 24 hours to prepare seed particles. The seed particles were washed with ultrapure water and methanol several times, and dried in a vacuum freeze dryer to obtain a powder. The particle diameter of the seed particles was measured using a Coulter counter (Multisizer III, Beckman Coulter). As a result, the seed particles had an average particle diameter of 1.05 μm and a CV value of 3.5%. The molecular weight of the seed particles was measured by GPC analysis. As a result, the seed particles had a molecular weight of 10,500 g/mol.

Preparation and Evaluation of Polymer Resin Particles 1.25 parts by weight of the seed particles were homogeneously dispersed in 350 parts by weight of an aqueous sodium lauryl sulfate (SLS) solution (0.2 wt %). Separately, a monomer mixture of 100 parts by weight of divinylbenzene (DVB), in which 1.5 parts by weight of benzoyl peroxide as an initiator was dissolved, was added to 400 parts by weight of an aqueous SLS solution (0.2 wt %). The resulting mixture was emulsified for 10 minutes using a homogenizer. The monomer emulsion was added to the seed particle dispersion to swell the monomer at room temperature. After completion of the swelling, 500 parts by weight of an aqueous polyvinyl alcohol solution (5 wt %) having a degree of saponification of about 88% was added thereto. After the temperature of the reactor was raised to 80° C., polymerization occurred. The crosslinked polymer divinylbenzene (PDVB) particles thus prepared were washed with ultrapure water and ethanol several times, and dried in vacuo at room temperature. The polymer resin particles had an average diameter of 4.0 μm and a CV value of 3.7%, which indicates a uniform particle diameter distribution. The K value of the polymer resin particles was measured using a micro-compression tester (MCT-W series, Shimadzu Corporation Ltd., Japan), and is shown in Table 1 below.

Preparation of Conductive Particles

Polymer resin particles (20 g) were etched by dipping the base particles in a mixed solution containing 10 g/L chromic acid and 400 g/L sulfuric acid for 10 minutes to form anchors on the surface of the base particles. The particles were then dipped in an aqueous tin (II) chloride solution (1 g/L) for 3 minutes, filtered and washed to sensitize the surface of the base particles. The base particles were collected, dipped in an aqueous palladium chloride solution (0.1 g/L) for 3 minutes, filtered and washed. After the washed base particles were dipped in a 10% hydrochloric solution for 3 minutes, the surface of the base particles was subjected to reduction treatment to form fine palladium nuclei thereon.

The catalyzed base particles were stirred at various speeds to prevent the formation of non-uniform plating arising from aggregation, adhesion and precipitation of the particles during plating. 20 g of the pretreated base particles were placed in a plating bath and sufficiently dispersed in a stirring plating bath containing a complexing agent. Then, an electroless Ni plating solution was added to the plating bath to form a Ni plating layer on the base particles. The Ni electroless plating solution was composed of nickel sulfate, sodium hypophosphite and potassium hydroxide in an equivalent ratio of 1:1:2. Electroless Ni plating was performed at 60° C. for 30 minutes. The pH at the initial stage of the plating reaction was 11.1, and the pH at the final stage of the plating reaction was adjusted to 6.0. After formation of a Ni plating layer, an electroless Au plating solution was fed into the plating bath to form a Ni/Au complex plating layer. The electroless Au plating solution was essentially composed of gold potassium cyanide (KAu(CN)$_2$) as a Au precursor, potassium cyanide (KCN), potassium hydroxide (KOH) and potassium carbonate (K$_2$CO$_3$). Preparation of such a Au plating solution is well known to one of skill in the art. After the electroless Au plating, the complex plating layer was washed and filtered to obtain conductive particles having a Ni/Au complex plating layer plated onto the base particles. Finally, the conductive particles were sufficiently washed with alcohol and dried under vacuum.

Example 2

Polymer resin particles were prepared in the same manner as in Example 1, except that a monomer mixture of 60 parts by weight of divinylbenzene and 40 parts by weight of styrene was used instead of 100 parts by weight of divinylbenzene. The polymer resin particles were measured to have an average particle diameter of 4.0 μm and a CV value of 3.6%. The polymer resin particles were used to prepare conductive particles using the procedure described in Example 1.

Example 3

The polymer resin particles of Example 2 were used to prepare conductive particles by electroless Ni/Au plating. The conductive particles were prepared in the same manner as in Example 1, except that an electroless Au plating solution was fed 20 minutes after initiation of the electroless Ni plating.

Comparative Example 1

The polymer resin particles of Example 1 were used to prepare conductive particles by electroless Ni/Au plating. Conductive particles were prepared in the same manner as in Example 1, except that a Ni/Au complex metal plating layer was introduced by performing the electroless plating using a mixed solution of nickel sulfate, sodium hypophosphite and sodium hydroxide in an equivalent ratio of 1:2:2 as an electroless Ni plating solution, and adjusting the pH of the solution to 7.4 using ammonia.

Comparative Example 2

The polymer resin particles of Example 2 were used to prepare conductive particles by electroless Ni/Au plating. Conductive particles were prepared in the same manner as in Example 1, except that a Ni/Au complex metal plating layer was introduced by using ammonia instead of potassium hydroxide in the electroless Ni plating solution to adjust the pH of the solution to 8.5.

Comparative Example 3

The polymer resin particles of Example 2 were used to prepare conductive particles by electroless Ni/Au plating. Conductive particles were prepared in the same manner as in Example 1, except that a Ni/Au complex metal plating layer was introduced by performing the electroless plating using a mixed solution of nickel sulfate, sodium hypophosphite and sodium hydroxide in an equivalent ratio of 1:2:2 as an electroless Ni plating solution, and adjusting the pH of the solution to 8.0 using ammonia.

Evaluation of Conductive Particles

The thickness of the plating layers of the conductive particles prepared in Examples 1-3 and Comparative Examples 1-3 was measured using an inductively coupled plasma (ICP) spectrometer in accordance with the following procedure. First, the respective Ni/Au plated conductive particles were added to aqua regia [nitric acid and hydrochloric acid (3:1 (v/v))] to completely dissolve the Ni and Au plating layers. The resulting solution was analyzed by ICP spectroscopy to determine the Ni, Au and phosphorus contents (wt %). Using the content (wt %) and specific gravity of the respective metal components and the specific gravity and average diameter of the respective polymer resin particles, the thickness of the Ni and Au layers was calculated.

The K values of the conductive particles were measured using a micro-compression tester, and the results are shown in Table 1.

The compression resistance of the conductive particles was determined by measuring the electrical resistance values of twenty particles in each sample and averaging the obtained values. At this time, the compression resistance was measured using a micro-compression tester, and was expressed as the resistance when the particles are compressively deformed by 10% by an applied force (10% compression resistance). The volume resistance of the conductive particles was determined as an electrical resistance value of bulk aggregates of the conductive particles, and the results are shown in Table 1.

In addition, resistance values at 50% compressive deformation (50% compression resistance) of the conductive particles were measured, and whether the plating layers were peeled or ruptured could be determined from a change in the resistance values. When the conductive particles are deformed, the contact area between the conductive particles and the upper and lower compression electrodes is increased. At this time, the resistance gradually decreases or remains constant. If the adhesiveness of the plating layer is poor and the peeling or rupture occurs during compressive deformation, the resistance of the conductive particles tends to increase in comparison with the initial resistance. Accordingly, the adhesion of the conductive metal layer to the polymer resin particles can be determined by observing the 50% compression resistance values.

Production and Evaluation of Anisotropic Conductive Adhesive Films 15 parts by weight of a bisphenol A epoxy resin having an epoxy equivalent of 6,000 and 7 parts by weight of 2-methylimidazole as a curing agent were dissolved in a mixed solvent of toluene and methyl ethyl ketone, and then 5 wt % of the respective conductive particles and a silane-based coupling agent were dispersed in the solution. The resulting dispersion was coated on a PET release film, and dried to produce an 18 μm-thick anisotropic conductive adhesive film.

The aggregation and dispersability of the conductive particles in the anisotropic conductive adhesive film were evaluated by observing the film (area: 1 mm$^2$) under an optical microscope at a magnification of 100-500×. When the number of aggregates having a size of five or more times the average diameter of the conductive particles was 0.1% or more of the total number of the conductive particles, the aggregation and dispersability of the conductive particles were judged to be "poor." Thus, in the case where the conductive particles have an average diameter of 4 μm and aggregates of the conductive particles have a size of 20 μm or more, the aggregation and dispersability of the conductive particles is judged to be 'good' when the number of the aggregates is less than 0.1% of the total number of the conductive particles, and is judged to be 'poor' when the number of the aggregates is 0.1% or more of the total number of the conductive particles.

First, the film was allowed to stand in a desiccator under drying conditions at room temperature (25° C.) for one hour. The film was interposed between an ITO-patterned glass substrate (lead width: 30 μm, pitch: 65 μm, thickness: 5,000 Å) and a chip on film (COF) (lead width: 25 μm, pitch: 65 μm, thickness: 9 μm) having a gold-plated copper circuit, followed by pressurization at 4 MPa while heating to 180° C. for 10 seconds to manufacture an electrical connection structure.

Electrical resistance values between 20 adjacent upper and lower electrodes of the connection sample were measured and averaged. The results are shown in Table 1. The connection reliability of the connection sample was evaluated by aging the connection sample at a temperature of 85° C. and a relative humidity (RH) of 85% for 1,000 hours, and measuring the connection resistance. In this test, the connection reliability of the conductive particles was evaluated based on the following criteria:

Good: Increment in resistance after high-temperature and high-humidity conditions≦1Ω

Average: 1Ω<Increment in resistance≦2.0Ω

Poor: 2.0Ω<Increment in resistance

The results of the reliability test under high-temperature and high-humidity conditions indicate that the plating layers of the conductive particles connecting electrodes by compressive deformation were stably maintained for a long period of time despite changes in ambient conditions.

TABLE 1

|  |  | Example No. | | | Comparative Example No. | | |
| --- | --- | --- | --- | --- | --- | --- | --- |
|  |  | 1 | 2 | 3 | 1 | 2 | 3 |
| Base particles | Average diameter (μm) | 4.0 | | | | | |
|  | 10% K value (kgf/mm$^2$) | 504 | 398 | | 504 | 398 | |
| Conductive particles | Thickness of Ni layer (nm) | 82 | 80 | 65 | 84 | 78 | 83 |
|  | Thickness of Au layer (nm) | 38 | 32 | 31 | 31 | 39 | 35 |
|  | Phosphorus content of plating layer (%) | 0.7 | 0.8 | 0.6 | 7.7 | 3.6 | 5.8 |
|  | 10% K value (kgf/mm$^2$) | 554 | 462 | 446 | 655 | 536 | 560 |
|  | 10% compression resistance (Ω) | 3.24 | 3.44 | 3.22 | 5.11 | 4.40 | 4.86 |
|  | 50% compression resistance (Ω) | 3.15 | 3.23 | 3.12 | 5.84 | 5.03 | 5.36 |
|  | Volume resistance (mΩcm) | 1.0 | 1.0 | 1.0 | 2.1 | 1.1 | 1.8 |
| Anisotropic conductive film | Dispersability | Good | Good | Good | Good | Good | Good |
|  | Initial connection resistance (Ω) | 0.8 | 0.9 | 0.8 | 2.9 | 1.0 | 2.2 |
|  | Connection resistance after high-temperature and high-pressure | 1.4 | 1.6 | 1.5 | 5.7 | 2.9 | 4.5 |

As can be seen from the data shown in Table 1, in some embodiments of the present invention, conductive particles may be highly flexible, have single particle low compression and volume resistance and show good dispersability in anisotropic conductive adhesive resins, thus achieving excellent electrical connection and high connection reliability upon anisotropic conductive interconnection.

Having described the preferred embodiments of the present invention, it is noted that modifications and variations can be made by persons skilled in the art in light of the above teachings. It is therefore to be understood that changes may be made in a particular embodiment of the present invention disclosed which is within the scope and the spirit of the invention outlined by the appended claims.

What is claimed:

1. A conductive particle comprising
a conductive nickel/gold (Ni/Au) complex metal layer having a phosphorous content of less than about 1.5 weight percent formed on the surface of a polymer resin particle, wherein the difference between the 10% K-value of the polymer resin particle and the conductive particle is about 100 kgf/mm$^2$ or less, and the polymer resin particle has a 10% K-value in a range of about 200 to about 700 kgf/mm$^2$.

2. The conductive particle according to claim 1, wherein the phosphorous content is in a range of about 0.3 to about 1.5 weight percent.

3. The conductive particle according to claim 1, wherein the Ni/Au complex metal layer comprises a first layer that is substantially Ni encompassed by a second layer that is substantially Au.

4. The conductive particle according to claim 1, wherein the Ni/Au complex metal layer comprises a Au density gradient wherein the Ni/Au complex metal layer consists essentially of Ni at the surface of the polymer resin particle and consists essentially of Au at the outer surface of the conductive particle.

5. The conductive particle according to claim 1, wherein the Ni/Au complex metal layer includes a gold plating layer having a thickness in a range of about 0.01 to about 0.5 µm.

6. The conductive particle according to claim 1, wherein the polymer resin particle has an average diameter of about 1 to about 20 µm, a CV value of about 10% or less and an aspect ratio of about 1.3 or less.

7. The conductive particle according to claim 1, wherein the polymer resin particle comprises a crosslinked polymer resin comprising a monomer selected from the group consisting of allyl compounds, polyethylene glycol diacrylate, polyethylene glycol dimethacrylate, polypropylene glycol diacrylate, polypropylene glycol dimethacrylate, pentaerythritol tetraacrylate, pentaerythritol tetramethacrylate, pentaerythritol triacrylate, pentaerythritol trimethacrylate, pentraerythritol diacrylate, pentaerythritol dimethacrylate, trimethylolpropane triacrylate, trimethylol propane trimethacrylate, dipentaerythritol hexaacrylate, dipentaerythritol hexamethacrylate, dipentaerythritol pentaacrylate, dipentaerythritol pentamethacrylate, glycerol triacrylate and glycerol trimethacrylate.

8. An anisotropic adhesive composition comprising the conductive particle of claim 1.

* * * * *